United States Patent [19]
Yonemoto

[11] Patent Number: 5,202,907
[45] Date of Patent: Apr. 13, 1993

[54] SOLID-STATE IMAGE SENSOR OUTPUT MOSFET AMPLIFIER WITH MOSFET LOAD

[75] Inventor: Kazuya Yonemoto, Tokyo, Japan
[73] Assignee: Sony Corporation, Tokyo, Japan
[21] Appl. No.: 892,930
[22] Filed: Jun. 3, 1992
[30] Foreign Application Priority Data
Jun. 4, 1991 [JP] Japan .................................. 3-159601
[51] Int. Cl.$^5$ ...................... G11C 19/28; H01L 29/78; H03F 3/16
[52] U.S. Cl. ..................................... 377/60; 257/239; 257/232; 257/368; 330/277
[58] Field of Search ................. 357/24, 30, 23.1, 23.3, 357/23.8, 23.9, 23.11, 23.12; 377/57-83; 330/277

[56] References Cited
U.S. PATENT DOCUMENTS

| | | | |
|---|---|---|---|
| 5,029,190 | 7/1991 | Narabu et al. | 377/60 |
| 5,068,736 | 11/1991 | Hamasaki | 357/24 |

Primary Examiner—Gene M. Munson
Attorney, Agent, or Firm—Hill, Steadman & Simpson

[57] ABSTRACT

There is provided a solid-state image sensor which can optimize the I-V characteristics of MOS transistors on drive side and load side, and which can improve the sensitivity by maximizing the small-signal AC gain of a source follower amplifier. According to one embodiment of the invention, a CCD solid-state image sensor has a floating diffusion type charge detecting amplifier composed of at least one drive side MOS transistor and at least one load side MOS transistor. In a substrate of one conductivity type, there are formed two wells of the opposite conductivity type independently. The drive side MOS transistor is formed in the first well which is deeper from the top surface of the semiconductor substrate. The load side MOS transistor is formed in the shallower second well. It is possible to further improve the AC gain by depleting or neutralizing the first well for the drive MOS transistor, and at the same time neutralizing the second well for the load MOS transistor.

10 Claims, 5 Drawing Sheets

SOLID-STATE IMAGE SENSOR OUTPUT MOSFET AMPLIFIER WITH MOSFET LOAD

BACKGROUND OF THE INVENTION

1. Field of the Invention

The present invention relates to a solid-state image sensor, and more specifically to a solid-state image sensor having a floating diffusion type charge detecting amplifier in an output circuit.

2. Description of the Prior Art

FIG. 1 schematically shows one conventional CCD imager of an interline transfer mode. This imager includes a two-dimensional (area) array of photosensors 1 and vertical registers 3. Each of the photosensors 1 constitutes one pixel element and accumulates signal charge corresponding to incident light flux. Each of the vertical shift registers 3 is provided for a unique one of vertical columns of the array. The accumulated charge is transferred instantaneously through a readout gate (or transfer gate) 2 into the associated vertical shift register 3 during a part of the vertical blanking interval, and the signal charge is shifted downwards in the vertical shift register 3. The photosensor array and the vertical shift registers 3 constitute a photosensitive imaging section (or area) 4. In this example, the photosensors 1 are photodiodes, and the vertical shift registers 3 are CCD (Charge Coupled Device) shift registers.

Then, the signal charges are transferred from the vertical shift registers 3 to a horizontal shift register 5 sequentially during a part of the horizontal blanking interval. The horizontal register 5 receives a series of signal charges corresponding to one scanning line at each time. From the horizontal shift register 5, the signal charges are transferred one after another to a floating diffusion (FD) 6 in the horizontal scanning interval of a television signal. The floating diffusion 6 is connected to an amplifier 7 for detecting signal charges. The amplifier 7 of this example is a two-state source-follower amplifier. The source-follower amplifier 7 generates an electric signal (such as a voltage signal) corresponding to the signal charge. The source-follower amplifier 7 has at least one drive side MOS transistor 8 and at least one load side MOS transistor 9.

FIG. 2 shows a cross sectional structure of the conventional source-follower amplifier 7. As shown in FIG. 2, the drive side MOS transistor 8 and the load side MOS transistor 9 are formed through a P well (P type region) 12 in and on a substrate of the CCD image sensor. The substrate of this example is an N type substrate 11. The P well 12 functions to achieve electrical isolation of active regions including the regions of the MOS transistors 8 and 9 from the backside of the substrate 11.

In the conventional source follower amplifier 7, however, the drive side MOS transistor 8 and the load side MOS transistor 9 are both formed in the single well 12 having a uniform structure. Therefore, the I-V characteristics of both transistors 8 and 9 are substantially the same, and it is not possible to optimize the characteristics of both transistors at the same time. The conventional source-follower amplifier 7 is, therefore, fabricated at the expense of the I-V characteristic of the load side MOS transistor 9 so that a short-channel effect (a greater drain conductance) remains. As a result, the gain of the amplifier is considerably limited as explained later.

OBJECTS AND SUMMARY OF THE INVENTION

It is therefore an object of the present invention to provide a high sensitivity solid-state image sensor having an output amplifier in which the I-V characteristics of MOS transistors on both of drive side and load side are optimized simultaneously, and the small-signal AC gain of the amplifier is enhanced.

According to one embodiment of the present invention, a solid-state image sensor has, as an output section, a floating diffusion type charge detecting amplifier. The amplifier comprises at least one drive side MOS transistor and at least one load side MOS transistor which are formed in and on a semiconductor substrate. The substrate comprises a substrate layer of a first conductivity layer, and first and second wells of a second conductivity type. For example, the first and second wells are P-type regions formed in the substrate of the N-type, and the remaining bulk region of the N type is the substrate layer. Each of the first and second wells extends into the substrate from the top surface of the substrate. The drive side MOS transistor comprises drain and source regions of the first conductivity type which are formed in the first well, and a first insulated gate electrode which is formed on the top surface of the first well through a gate insulating layer. The load side MOS transistor comprises drain and source regions of the first conductivity type which are formed in the second well, and a second insulated gate electrode which is formed on the top surface of the second well through a gate insulating layer. The first well for the drive side MOS transistor is deeper from the top surface of the substrate than the second well, and the second well for the load side MOS transistor is shallower. The shallower second well may be neutralized in potential.

In the second well of the load side MOS transistor, a neutral region is formed at a relatively shallow depth from the top surface of the substrate. This structure, therefore, makes the load side MOS transistor less susceptible to channel modulation from its drain/source region, and weakens short-channel effect. As a result, the drain conductance of the load side MOS transistor is decreased.

The deep first well of the drive side MOS transistor is depleted in potential, a back gate of the MOS transistor is formed by an end of a depletion layer extending into a deep portion of the substrate. Therefore, this structure can lessen the influence of the back gate voltage on the channel portion of the MOS transistor, and thereby reduce the back gate transconductance of the drive side MOS transistor.

BRIEF DESCRIPTION OF THE DRAWINGS

FIGS. 6A and 6B show the Id-Vd characteristics of the drive side MOS transistors of the conventional structure and the structure shown in FIG. 1, respectively. FIGS. 7A and 7B show, respectively, the Id-Vg characteristics of the drive side MOS transistors of the conventional example and the first embodiment of the invention. FIGS. 8A and 8B show the Id-Vd characteristics of the load side MOS transistors in the conventional example and the first embodiment, respectively.

DESCRIPTION OF THE PREFERRED EMBODIMENTS

Figure 4:
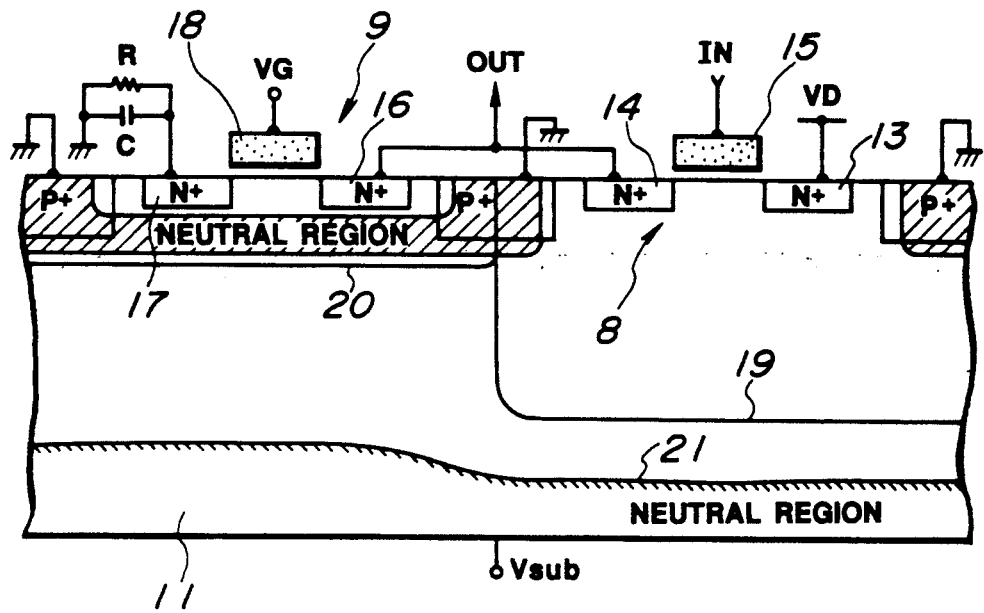
FIG. 4 is a cross sectional view showing a structure of a signal charge detecting source follower amplifier according to a first embodiment of the present invention.

FIG. 4 shows a source-follower amplifier of a CCD image sensor according to a first embodiment of the present invention.

The source-follower amplifier comprises at least one driver's side MOS transistor 8 and a load's side MOS transistor 9 which are both formed in and on a substrate 11 of the CCD solid-state image sensor. In this example, the substrate 11 is an N-type substrate.

As shown in FIG. 4, there are formed first and second wells (or well regions) 19 and 20 which both extend into the substrate 11 from a top surface of the substrate 11. In this example, the first and second wells 19 and 20 are of the P type. As shown in FIG. 4, the N-type layer of the substrate 11 extends from the bottom surface of the substrate 11 to the bottoms of the first and second P wells 19 and 20. The first P well 19 is deeper from the top surface of the substrate than the second P well 20, and the second P well 20 is shallower. As shown in FIG. 4, at least one P+-well contact region is formed in the first and second P wells 19 and 20, and connected to a ground.

A first pair of N+-type drain and source regions 13 and 14 is formed in the deep P well 19, and constitutes the drive side MOS transistor 8 together with a gate electrode 15 formed above a channel region between the drain and source regions 13 and 14. Similarly, the load side MOS transistor 9 is formed in an area adjacent to the drive side MOS transistor 8. The load side MOS transistor 9 includes a second pair of N+-type drain and source regions 16 and 17 which is formed in the shallow P well 20, and a gate electrode 18 formed above a channel region between the drain and source regions 16 and 17. In this embodiment, the first P well 19 is depleted in potential, while on the other hand the second P well 20 is neutralized in potential (to a ground potential).

The source-follower amplifier of this embodiment can improve the AC gain for small-signal operation.

Figure 1:
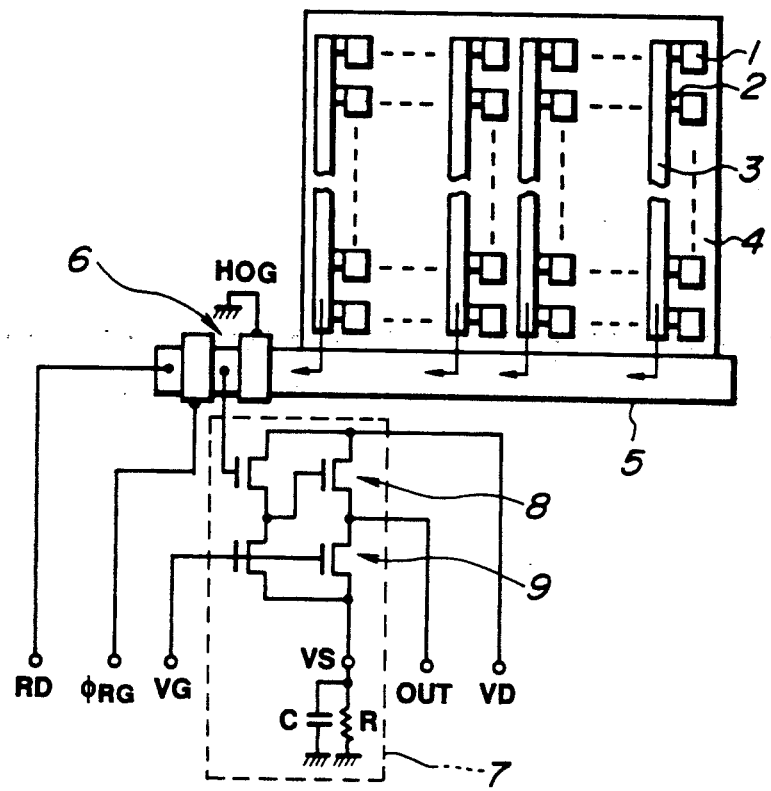
FIG. 1 is a schematic view showing an interline transfer type CCD solid-state image sensor.

In general, the small-signal AC gain G of the source follower amplifier 7 shown in FIG. 1 is given by;

$$G = gm/(gm + gs + gb + gsl) \quad (1)$$

In this equation, gm, gs and gb are, respectively, transconductance, drain conductance and back gate transconductance of the drive side MOS transistor 8, and gsl is a drain conductance of the load side MOS transistor 9.

Figure 3A:
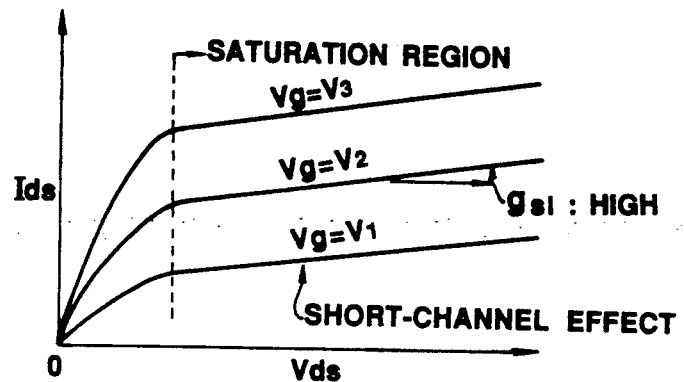
FIGS. 3A and 3B are graphs showing I-V characteristics of the load side MOS transistor of the conventional example, and ideal characteristics.
Figure 3B:
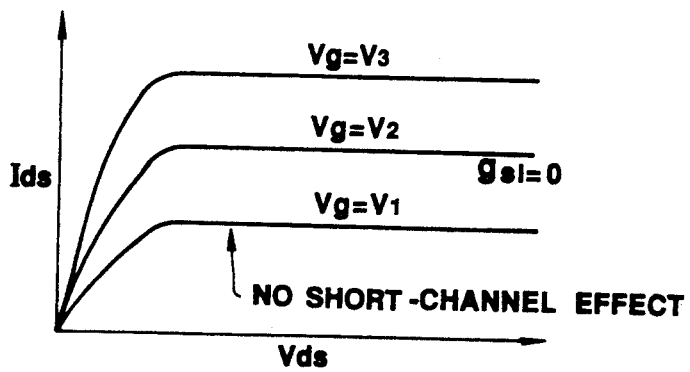

FIG. 3A show the I-V characteristics of the load side MOS transistor 9 of the conventional source-follower amplifier 7. As shown in FIG. 3A, the conventional structure makes the drain conductance gsl high as compared with ideal characteristics shown in FIG. 3B, and therefore, the gain of the conventional amplifier is low. On the part of the drive side MOS transistor 8, the p well 12 is not deep enough. Therefore, the back gate transconductance gb is high, and further decreases the amplifier gain.

Figure 5:
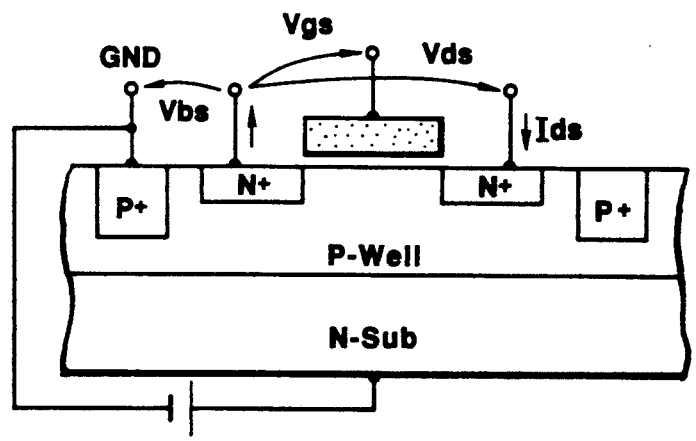
FIG. 5 is a schematic view showing a circuit configuration for measuring I-V characteristics of MOS transistors.
Figure 6A:
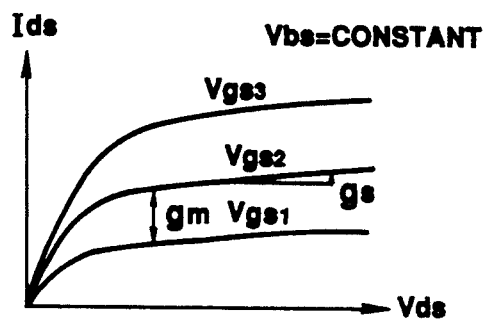
FIGS. 6A, 7A and 8A are graphs showing I-V characteristics of the MOS transistors of the conventional source follower amplifier.
Figure 6B:
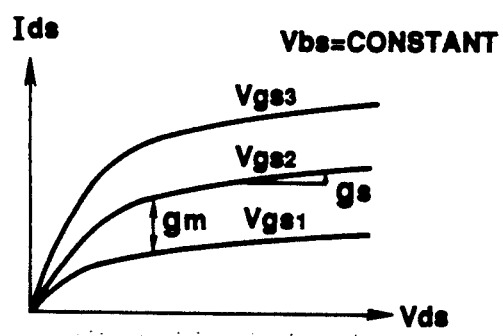
FIGS. 6B, 7B and 8B are graphs showing I-V characteristics of the MOS transistors in the source follower amplifier shown in FIG. 1.
Figure 7A:
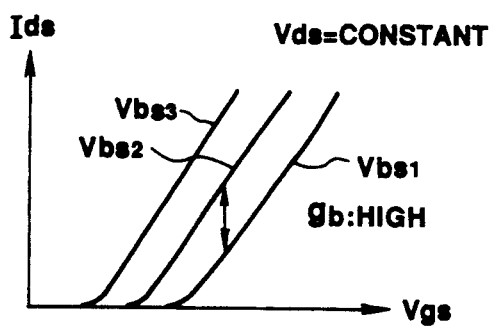
Figure 7B:
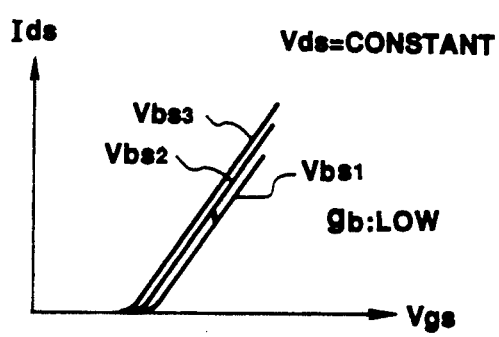
Figure 8A:
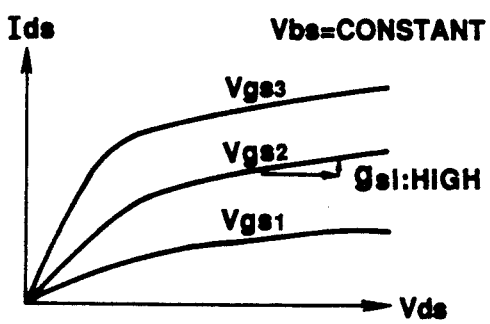
Figure 8B:
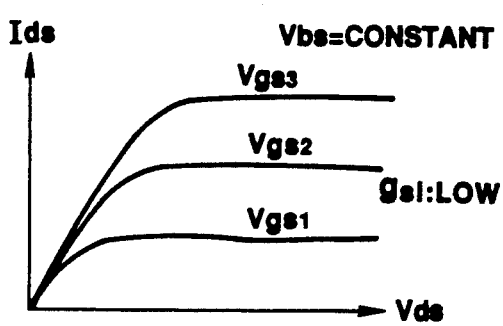

FIGS. 6B, 7B and 8B show, respectively, I-V characteristics of the source follower amplifier according to the first embodiment of the invention, along with graphs of FIGS. 6A, 7A and 8A showing characteristics of the conventional source-follower amplifier. These characteristics are measured by using a circuit shown in FIG. 5.

The Id-Vd characteristics of the drive side MOS transistor of the embodiment as shown in FIG. 6B are similar to the conventional characteristics shown in FIG. 6A. In the conventional device, however, the back gate transconductance gb of the drive side MOS transistor 8 and the drain conductance gsl of the load side MOS transistor 9 both have great values, which add up to a considerable decrease in the AC gain of the source-follower.

In the source-follower amplifier of the embodiment, by contrast, the P well 20 for the load side MOS transistor 9 is made shallower from the top surface of the substrate, and held potentially in the neutral state, and the P well 19 for the drive side MOS transistor 8 is made deeper and held in the depletion state. Therefore, it is possible to obtain the characteristics shown in FIGS. 7B and 8B. FIG. 7B shows the Id-Vg characteristics of the drive side MOS transistor 8. FIG. 8B shows the Id-Vd characteristics of the load side MOS transistor 9. In the source-follower amplifier of this embodiment, the back gate transconductance gb of the drive side MOS transistor 8 is small as shown in FIG. 7B, and the drain conductance gsl of the load side MOS transistor 9 is also small as shown in FIG. 8B. That is, the structure of the source-follower of this embodiment can improve the AC gain G by decreasing both of the back gate transconductance gb of the drive side MOS transistor 8 and the drain conductance gsl of the load side MOS transistor 9.

Figure 2:
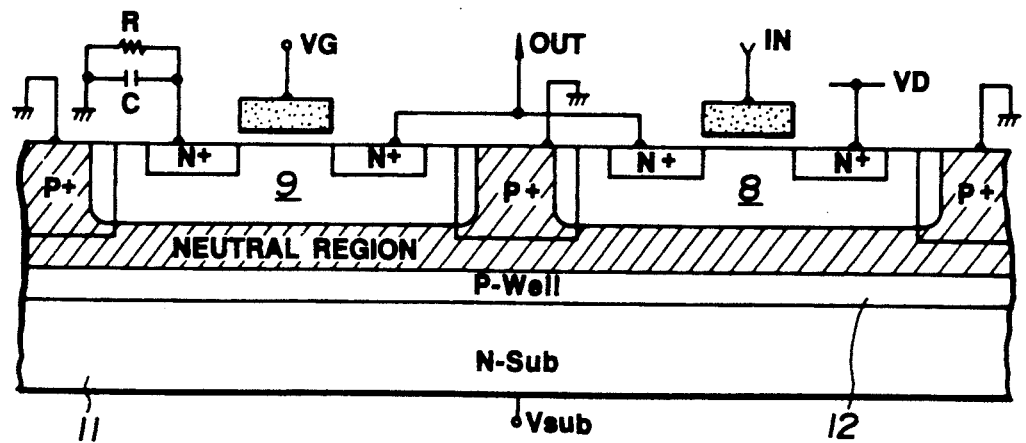
FIG. 2 is a cross sectional view showing the structure of a conventional source follower amplifier.

In the conventional example shown in FIG. 2, the back gate is formed by the neutral region of the relatively shallow P well 12. In the source-follower amplifier 7 of this embodiment, on the other hand, the back gate of the drive MOS transistor 8 is formed by an end 21 of the depletion layer which extends deep into the substrate, so that the channel portion of the MOS transistor 8 undergoes little or no influence. This is the reason why the structure of the embodiment can decrease the back gate transconductance gb of the drive side MOS transistor 8.

In the P well 20 for the load side MOS transistor 9 of the embodiment, the neutral regions is formed at a very shallow level as compared with the neutral region of the P well 12 shown in FIG. 2. Therefore, the structure of the embodiment is less susceptible to channel modulation from the drain region 16/the source region 17. As a result, the structure of the embodiment makes it possible to lower the short-channel effect and increase the drain conductance gsl of the load side MOS transistor 9.

Figure 9:
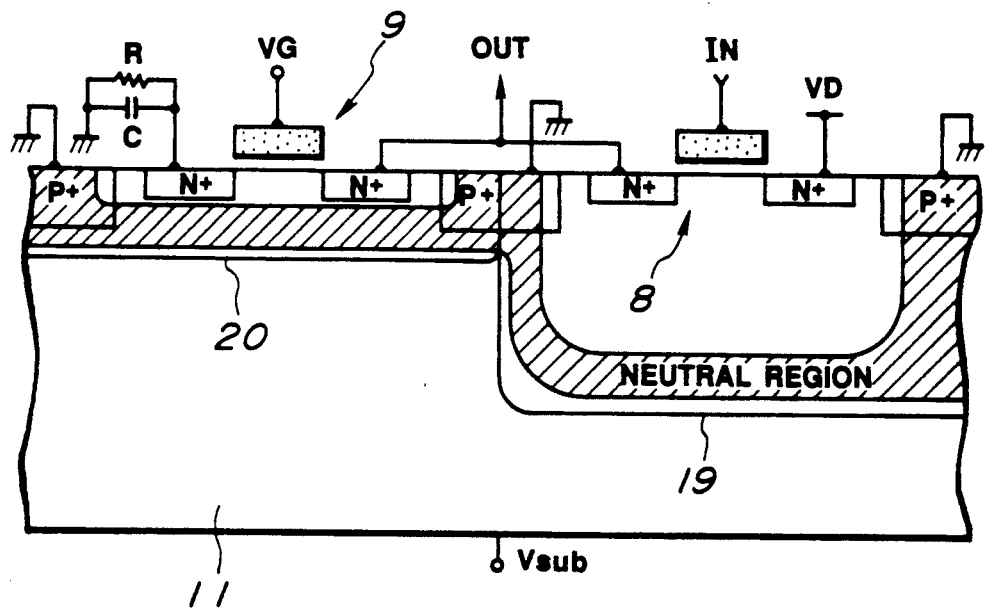
FIG. 9 is a cross sectional view showing a source follower amplifier according to a second embodiment of the present invention.

FIG. 9 shows a source-follower amplifier according to a second embodiment of the present invention. The structure of FIG. 9 is almost the same as the structure shown in FIG. 4. In particular, the structure of the second embodiment also includes the deep first P well 19 for the drive side MOS transistor 8, and the shallow second P well 20 for the load side MOS transistor. In the second embodiment, however, a neutral region is formed in the deep first P well 19 too.

In the deep P well 19, the neutral region is formed deeply from the top surface of the substrate, as shown in FIG. 9. Therefore, the source-follower amplifier of the second embodiment can reduce the back gate transconductance gb to a sufficiently small value, and hence improve the AC gain given by the equation (1) as in the first embodiment shown in FIG. 4.

In the structure according to the second embodiment, the neutral region is formed in each of the P wells 19 and 20 for the drive side and the load side. Therefore, the operation of the source-follower is not readily influenced by variation in the semiconductor process. Furthermore, this structure prevents the operating point of the source-follower amplifier 7 from being shifted by a change in voltage of the substrate when an electronic shutter takes action by sweeping charges into the substrate. Therefore, the source-follower amplifier does not exert adverse influence on the signal processing circuit.

According to the present invention, as explained above, the first P well of the drive side MOS transistor is made deeper, and the second P well for the load side MOS transistor is made shallower and potentially neutralized. Therefore, the source-follower amplifier according to the present invention can significantly lessen the influence of the neutral region of the substrate on the channel portion of the drive side MOS transistor, and thereby decrease the back gate transconductance gb of the drive MOS transistor. On the other hand, the source-follower amplifier of the present invention can decrease the drain conductance gsl of the load side MOS transistor by restraining the channel modulation and reducing the short-channel effect. In this way, it is possible to improve the sensitivity of the device by adjusting the I-V characteristics of the drive side and load side MOS transistors to their respective best forms, and maximizing the small-signal AC gain of the source-follower.

What is claimed is:

1. A solid-state imager comprising:
   a substrate layer of a first conductivity type in a semiconductor substrate;
   first and second wells of a second conductivity type formed in said substrate layer, said first and second wells both extending into said substrate from a top surface of said substrate;
   a pair of first drain and first source regions of the first conductivity type formed in the first well region;
   a pair of second drain and second source regions of the first conductivity type formed in the second well region;
   a first insulated gate electrode formed on said top surface of said substrate, said first gate electrode forming a drive side MOS transistor with said first drain and source regions; and
   a second insulated gate electrode formed on said top surface of said substrate, said second gate electrode forming a load side MOS transistor with said second drain and source regions, said drive side MOS transistor and said load side MOS transistor being connected to form a floating diffusion type output amplifier of said solid-state imager;
   wherein said first well is deeper from said top surface of said substrate than said second well.

2. A solid-state imager according to claim 1 wherein said first well is depleted in potential.

3. A solid-state imager according to claim 2 wherein said second well is neutralized in potential.

4. A solid-state imager according to claim 1 wherein a junction between said first well and said substrate layer is located near an end of a depletion layer of said substrate layer.

5. A solid-state imager according to claim 1 wherein said first and second wells are both neutralized in potential.

6. A solid-state imager according to claim 1 further comprising a highly doped contact region of the second conductivity type for neutralizing said second well in potential, said highly doped contact region being formed in said second well, and grounded.

7. A solid-state imager according to claim 6 further comprising a highly doped contact region of the second conductivity type which is formed in said first well and which is grounded.

8. A solid-state imager according to claim 7 wherein said output amplifier comprises a floating diffusion and a source follower amplifier which is formed by said drive side MOS transistor and said load side MOS transistor.

9. A solid-state imager according to claim 8 wherein said source follower amplifier comprises an input terminal for receiving an input signal from said floating diffusion, an output terminal for delivering an output signal, said first source region of said drive side MOS transistor and said second drain region of said load side MOS transistor being both connected to said output terminal, said first gate electrode of said drive side MOS transistor being connected to said input terminal.

10. A solid-state imager according to claim 9 further comprising an interline CCD imaging section which comprises a horizontal shift register connected with said floating diffusion, a plurality of vertical shift registers each of which is connected with said horizontal shift register, and an array of photosensitive elements each of which is connected with one of said vertical shift register.

* * * * *